United States Patent [19]

Isaacs et al.

[11] Patent Number: 5,557,503

[45] Date of Patent: Sep. 17, 1996

[54] CIRCUIT CARD HAVING A LARGE MODULE STRAIN RELIEF AND HEAT SINK SUPPORT

[75] Inventors: Phillip Isaacs, Rochester; Miles Swain, Hayfield, both of Minn.

[73] Assignee: International Business Machines Corporation, Armonk, N.Y.

[21] Appl. No.: 440,182

[22] Filed: May 12, 1995

[51] Int. Cl.⁶ ........................................ H05K 7/70
[52] U.S. Cl. .......................... 361/719; 361/773; 439/487
[58] Field of Search .................... 439/55, 83, 485, 439/487; 211/41; 165/80.3, 185; 174/16.3, 252; 361/704, 705, 707, 713, 717–719, 760, 764, 773, 790–792, 807, 809

[56] References Cited

U.S. PATENT DOCUMENTS

| | | |
|---|---|---|
| 3,911,327 | 10/1975 | Murari et al. . |
| 4,498,120 | 2/1985 | Kaufman . |
| 4,665,467 | 5/1987 | Speraw et al. . |
| 4,679,118 | 7/1987 | Johnson et al. . |
| 4,853,828 | 8/1989 | Penn . |
| 4,878,108 | 10/1989 | Phelps, Jr. et al. . |
| 5,141,829 | 8/1992 | Dumas ........................................ 430/5 |
| 5,155,661 | 10/1992 | Nagesh et al. . |
| 5,182,632 | 1/1993 | Bechtel ................................... 257/713 |
| 5,184,211 | 2/1993 | Fox . |
| 5,268,815 | 12/1993 | Cipolla et al. . |
| 5,280,411 | 1/1994 | Dirks ....................................... 361/707 |
| 5,305,185 | 4/1994 | Samarov et al. . |
| 5,426,405 | 6/1992 | Miller ..................................... 333/247 |
| 5,468,917 | 11/1995 | Brodsky ................................... 174/255 |

*Primary Examiner*—Gerald P. Tolin
*Attorney, Agent, or Firm*—Craig J. Yudell; Andrew J. Dillon

[57] ABSTRACT

A circuit card having module strain relief and heat sink support is provided. The circuit card comprises a printed circuit board having a front and a back, a module mounted to the front of the printed circuit board, and a stiffening structure mounted to the back of the printed circuit card directly opposite from the module to provide rigidity to the printed circuit board. The module has a plurality of electrical leads making electrical connection with the printed circuit board and anchoring the module to the printed circuit board. The stiffening structure is coextensive with the plurality of electrical leads along the printed circuit board, and is of sufficient thickness and strength to resist flexure of an area of the printed circuit board in contact with the stiffening structure in response to shock and vibration applied to the module.

12 Claims, 4 Drawing Sheets

5,557,503

1

CIRCUIT CARD HAVING A LARGE MODULE STRAIN RELIEF AND HEAT SINK SUPPORT

BACKGROUND OF THE INVENTION

1. Technical Field

The present invention relates in general to printed circuit card mechanical design, and in particular to printed circuit card mechanical design providing strain relief to mounted components.

2. Description of the Related Art

The conventional approach to the fabrication of large, dense multi-chip electronic packages has been the large or very large scale integrated circuit in which a single large monolithic silicon chip is used as a substrate on which all required circuits are integrated. The chip is then packaged in one of several multi-lead electronic packages. As an alternative to such single chip modules (SCM), multi-chip modules (MCM) have been developed. In a typical MCM, complex circuitry is distributed among two or more separate chips, or sub-chips. Each such sub-chip contains only a portion of the overall circuitry of the MCM and is, therefore, substantially less complex and expensive to design, prototype, build and test than the equivalent monolithic chip. Such modular designs produce circuitry components that are substantially larger then most other components mounted to a circuit board.

SCMs and MCMs are often designed as surface mounted devices, which are mounted directly on the circuit board by soldering the module's leads directly to the circuit board. Often, the soldered leads are not only providing the electrical connections from the module to the circuit board, but are the only mechanical means of anchoring or attaching the surface mounted module to the board. Unfortunately, because of the large mass of the modules and the comparatively thin circuit card cross-section underlying the module, any vibration of the module in the normal direction or rotational direction from the card, or lateral shock loads transmitted through the module into the card will cause a high level of stress in the edge and corner solder joints of the module.

Moreover, because such large microcircuit modules are highly susceptible to damage from heat generated internally, large heat sinks having small thin metal extrusions or fins are often mounted to the top of the modules. The addition of this mass of the heat sink only enhances the problem of stress and strain of the edge and corner solder joints.

This stress and strain on the modules electrical connections cause an unusually high field failure rate of the package. Therefore, it would be desirable to provide a means of module strain relief to prevent card and module vibration from causing high stress and failure to solder joints on the edge and corner joints of a many leaded surface mounted module and heat sink.

SUMMARY OF THE INVENTION

It is therefore an object of the present invention to provide a means of strain relief to evenly spread the stress and strain caused by vibration and shock among the leads of a surface mounted module and heat sink to prevent fatigue and failure of particularly corner and edge electrical connections.

According to the present invention, a circuit card having module strain relief and heat sink support is provided. The circuit card comprises a printed circuit board having a front and a back, a module mounted to the front of the printed circuit board, and a stiffening structure mounted to the back of the printed circuit card directly opposite from the module to provide rigidity to the printed circuit board. The module has a plurality of electrical leads making electrical connection with the printed circuit board and anchoring the module to the printed circuit board. The stiffening structure is coextensive with the plurality of electrical leads along the printed circuit board, and is of sufficient thickness and strength to resist flexure of an area of the printed circuit board in contact with the stiffening structure in response to shock and vibration applied to the module.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
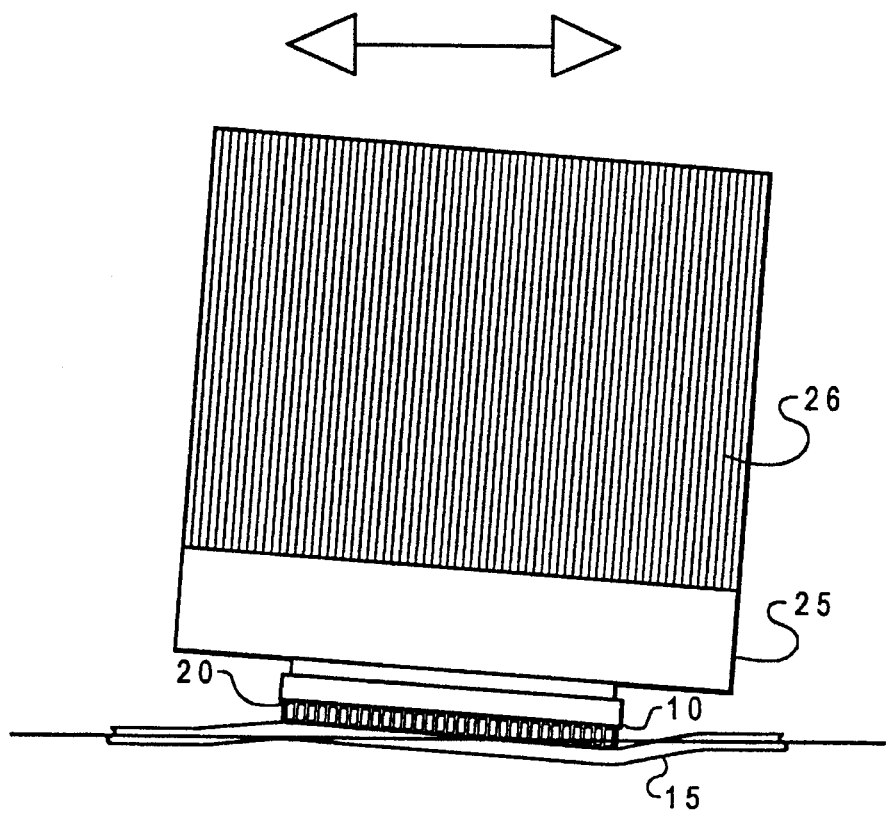
FIG. 1 depicts an electronic module under a lateral shock load mounted to a printed circuit board in a prior art manner.

FIG. 1 depicts an electronics module 10 conventionally mounted and under a lateral shock load. The electronics module 10 is mounted to a printed circuit board 15. Module 10 has a plurality of electrical leads 20 that are soldered to printed circuit board 15. Electrical leads 20 and their solder joints provide an electrical connection for the circuits and microchips contained in module 10 to the printed circuit board 15 and other components attached to the circuit card. Mounted to module 10, for example, by epoxy, is heat sink 25. Heat sink 25 typically has a solid metal base and a plurality of fins 26 extending therefrom.

When module/heat sink combination 10, 15 is subjected to lateral shock loads, the mass of the combination will cause flexure of the printed circuit board 15, as seen in FIG.

1. This flexure is caused by the lateral shock being transmitted through the electrical leads 20 to the printed circuit board 15. The strain and stress of the shock is particularly focused at the corner and edge leads. As seen in FIG. 1, the electrical leads 20 from the center of module 10 out to the left edge are progressively under increasing tension, and the electrical leads 20 from the center of module 10 out to the right edge are under progressively increasing compression.

Figure 2:
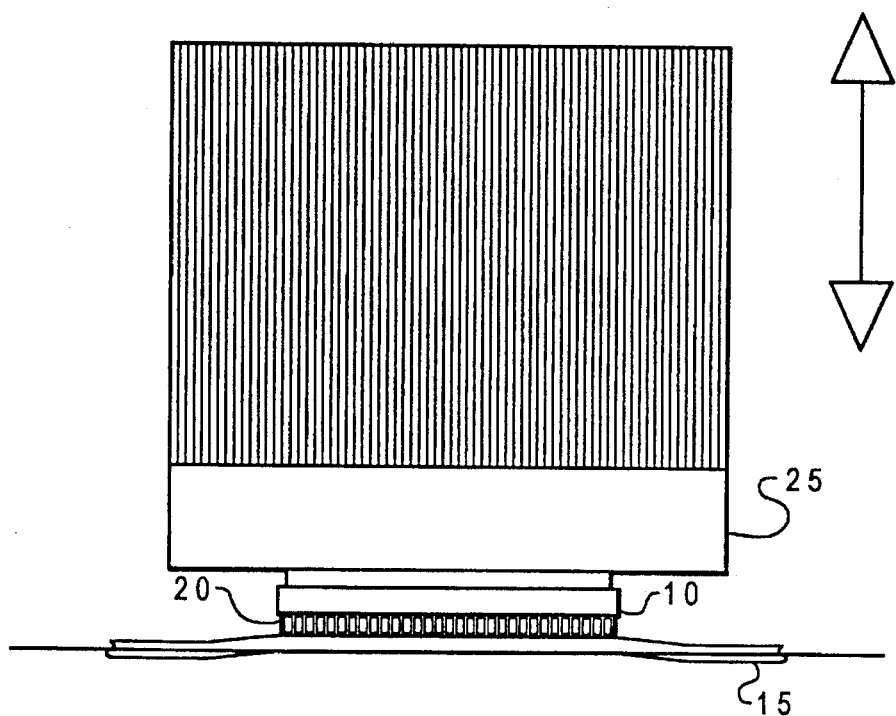
FIG. 2 depicts a module mounted in a prior art manner to a circuit card being subjected to shock loads normal to the plane of the card.

FIG. 2 depicts the module/heat sink combination 10, 25 being subjected to shock loads normal to the plane of the card, causing of printed circuit card 15. As will be appreciated by those skilled in the art, electrical leads 20, which are anchoring module 10 to printed circuit card 15, are being subjected to severe strain, particularly at the right and left edges of module 10.

Figure 3:
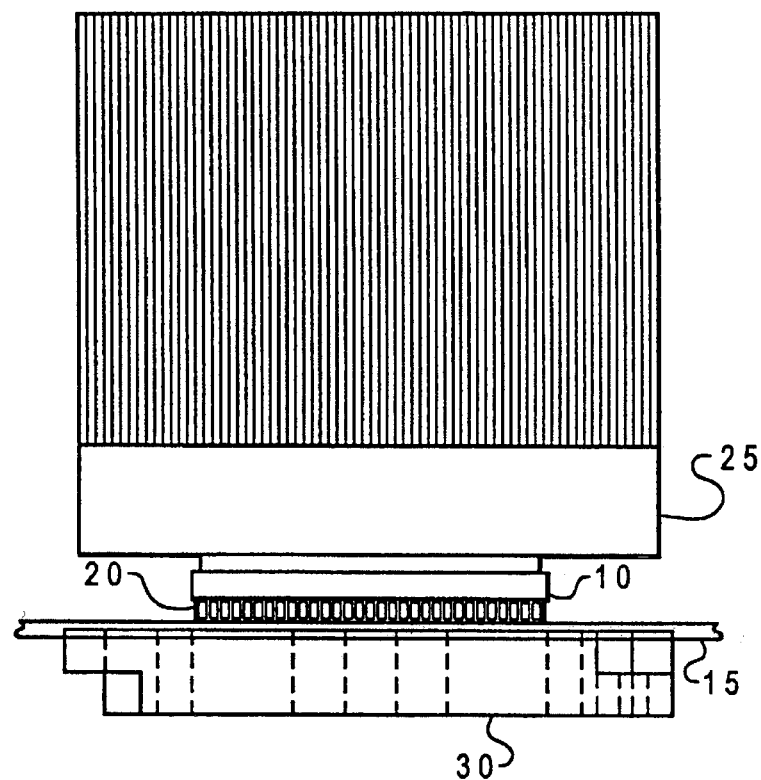
FIG. 3 depicts a side view of a module mounted to a printed circuit card having a module strain relief, in accordance with the preferred embodiment of the present invention.

With reference now to FIG. 3, there is shown a side view of the printed circuit card having module strain relief, in accordance with the preferred embodiment of the present invention. FIG. 3 depicts electronics module 10 mounted to printed circuit board 15. Mounted to module 10, for example, by epoxy, is heat sink 25. Module 10 has a plurality of electrical leads 20 that are conventionally soldered to printed circuit board 15. Electrical leads 20 and their solder joints provide an electrical connection for the circuits and microchips contained in module 10 to the printed circuit board 15 and other components attached to the circuit card. Module 10 shown in FIG. 3 is a single chip module (SCM) or a multi-chip module (MCM). However, it will be appreciated by those skilled in the art that module 10 could be any type of electrical device capable of being mounted on a printed circuit board, and that the present invention is not intended to be limited to SCMs or MCMs.

In a preferred embodiment of the present invention, module 10 is a surface mounted device, which is mounted directly on the circuit board by soldering the module's leads directly to the circuit board. The soldered leads 20 are not only providing the electrical connections from the module to the circuit board, but are the only mechanical means of anchoring or attaching the surface mounted module to the board; although, it is possible to provide additional rigidity and anchoring by bonding the bottom of the module to the printed circuit board.

Stiffening structure 30 is mounted to the back of the printed circuit card directly opposite from the module 10, which is mounted directly on the front of the circuit card. In accordance with the preferred embodiment of the present invention, stiffening structure 30 has a width substantially greater than the width of module 10. However, according to the present invention, the perimeter of stiffening structure 30 should be at least coextensive with the electrical connections 20 anchoring module 10 to circuit board 15 to provide the optimum strain relief. Stiffening structure 30 has a thickness much greater than the thickness of printed circuit board 15. However, those skilled in the art will appreciate that the required thickness will vary depending on the flexural modulus of the material of which it is made.

In a preferred embodiment of the present invention, stiffening structure 30 is made from materials of relatively high flexural modulus and which is a good dielectric, such as composite structures of fiberglass/epoxy, graphite/epoxy, liquid crystal polymer, etc., but many materials such as aluminum plastic, etc., may be used as well. Using plastic allows the stiffening structure to be easily formed. The stiffening structure can be bonded or bolted to the printed circuit board. Heat sink 25 is mounted to and supported by module 10 conventionally.

Figure 8:
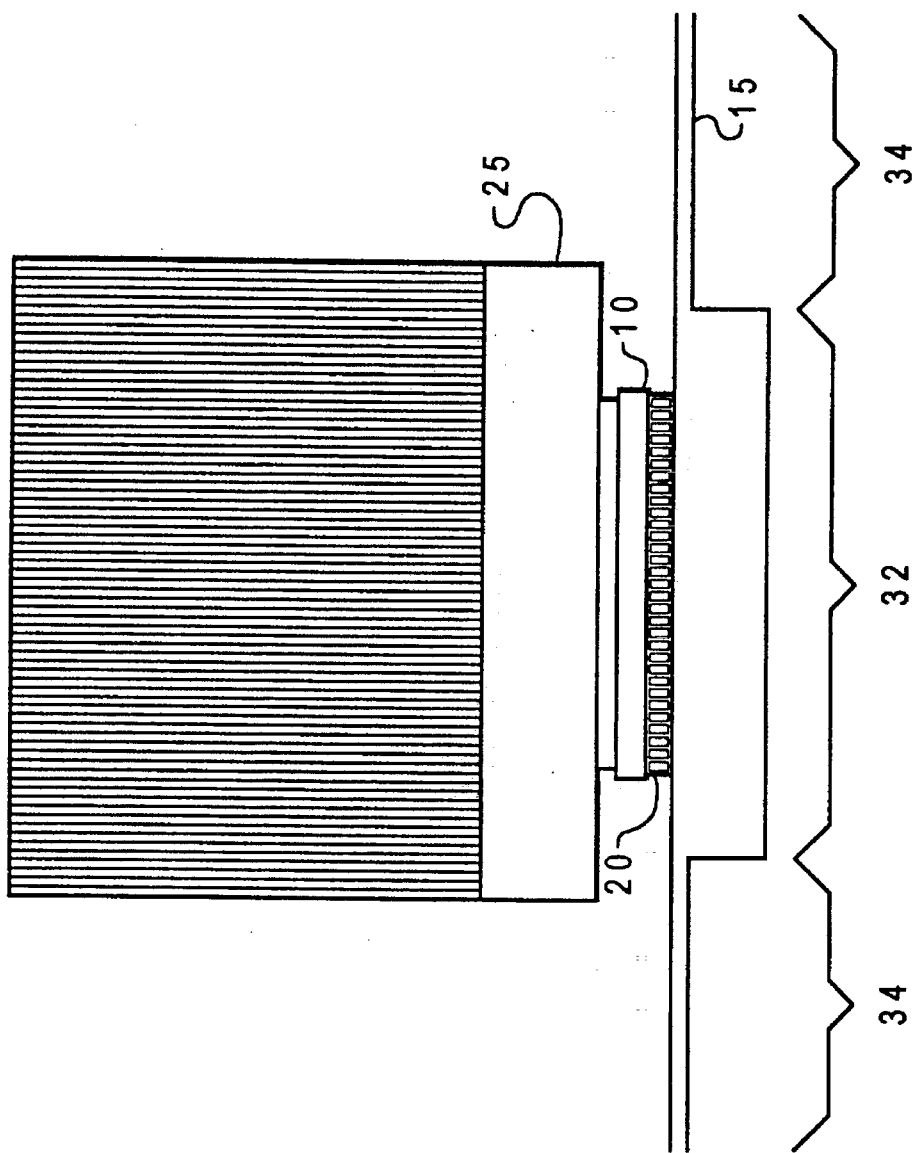
FIG. 8 depicts a side view of a module mounted to a printed circuit card having a module strain relief formed integrally with the printed circuit card, in accordance with a preferred embodiment of the present invention.

In an alternative preferred embodiment of the present invention, the stiffening structure is formed as an integral portion of the printed circuit board during its manufacture. Printed circuit boards are made by laminating a thin copper layer to a thicker layer of insulating plastic. The stiffening structure of the present invention can be molded into the insulating layer of the printed circuit board, such that the printed circuit board 15 has a thicker region 32 and a thinner region 34, as depicted in FIG. 8.

As will be appreciated by those skilled in the art, the rigidity provided to the printed circuit board by the stiffening structure creates a resistance to flexure that may occur in the area of the printed circuit board in contact with the stiffening structure, in response to shock and vibration applied to the module and heat sink mounted directly above the stiffening structure. In particular, the stiffening structure prevents the card from flexing at the edge pins or corner pins of the module. As a result, any stress loads applied to the module would be spread equally across all of the solder joints anchoring the module.

Figure 4:
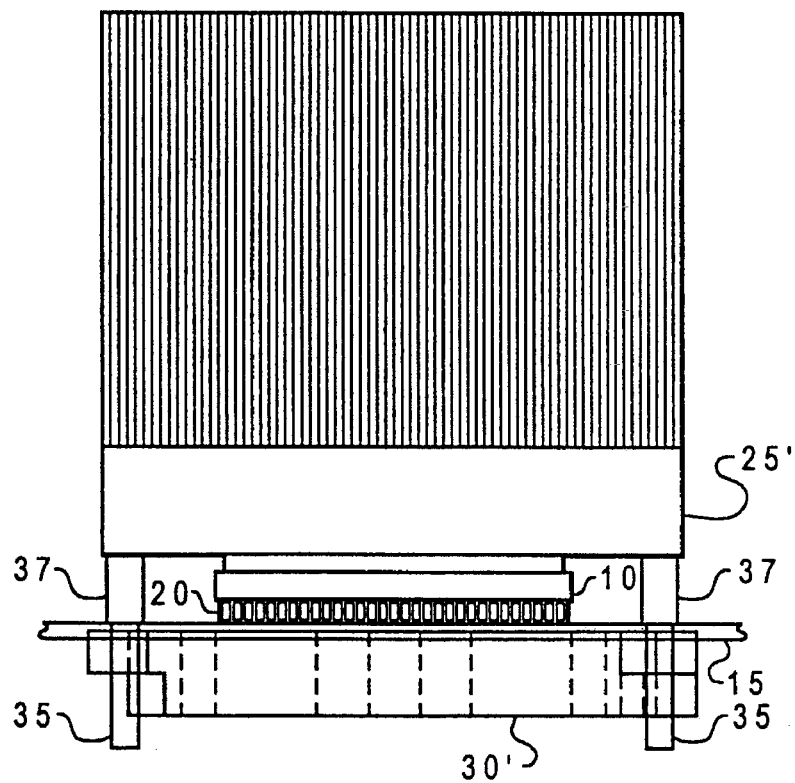
FIG. 4 depicts a side view of a module mounted to a printed circuit board having a module strain relief and heat sink support, in accordance with an alternate embodiment of the present invention.

Referring now to FIG. 4, there is shown an alternative preferred embodiment of the module strain relief and heat sink support of the present invention. As in FIG. 3, module 10 is anchored to printed circuit board 15 by the module's electrical leads 20, which are soldered to the board. In this embodiment, legs 35 pass through mounting holes in stiffening structure 30' and printed circuit board 15 and are screwed into nut 37. Nut 37 is fixedly attached to heat sink 25'. Preferably there are four of the legs 35, one at each corner of the base of heat sink 25'.

Together, leg 35 and nut 37 form a standoff device 35, 37. The standoff device 35, 37 perform two functions. First, legs 35 can be designed to grip stiffening structure 30' to securely mount the stiffening structure against printed circuit board 15. This eliminates the need to bond the stiffening structure to the printed circuit board.

Second, the standoff devices directly support the heat sink 25', thereby taking stress and strain off of module 10 and its electrical leads 20. Preferably, nut 37 is formed from a shock absorbing material such as an elastomer, but, alternatively, nut 37 can be formed from a rigid material, such as metal or plastic. Any lateral or normal shock loads applied to the heat sink will have its force transmitted through the standoff device 35, 37 into the printed circuit board 15 and stiffening structure 30' directly, eliminating any transmission of the shock load to the solder joints of electrical leads 20.

Another advantage to the heat sink support design of the present invention is its ability to facilitate heat dissipation from module 10. First, standoff device 35, 37 can be made from a thermally conductive material to allow heat transfer from heat sink 25' to stiffening structure 30'. If stiffening structure 30' is made from a proper material, aluminum or copper for example, the stiffening structure and standoff device combination create an additional thermal conduction path to facilitate heat dissipation to the back side of the printed circuit board. The heat sink may also have additional features or more surface area such as pin fins, etc. Second, standoff device 35, 37 are thin cylindrical devices having a small cross-sectional area relative to the module 10 and are located at each of the corners of the stiffening structure 30', and so are spaced apart. Thus, the large open spaces between the standoff devices 35, 37 provide a substantial amount of free flow of air around module 10 to provide additional cooling via convection.

Although not shown, it will be appreciated by those skilled in the art that two additional standoff devices are mounted to the circuit board in a similar manner in the corners opposite to those shown in FIG. 4. Thus, a standoff device would be mounted in each of the mounting holes of the stiffening structure, as will be appreciated with reference to FIG. 5.

Figure 5:
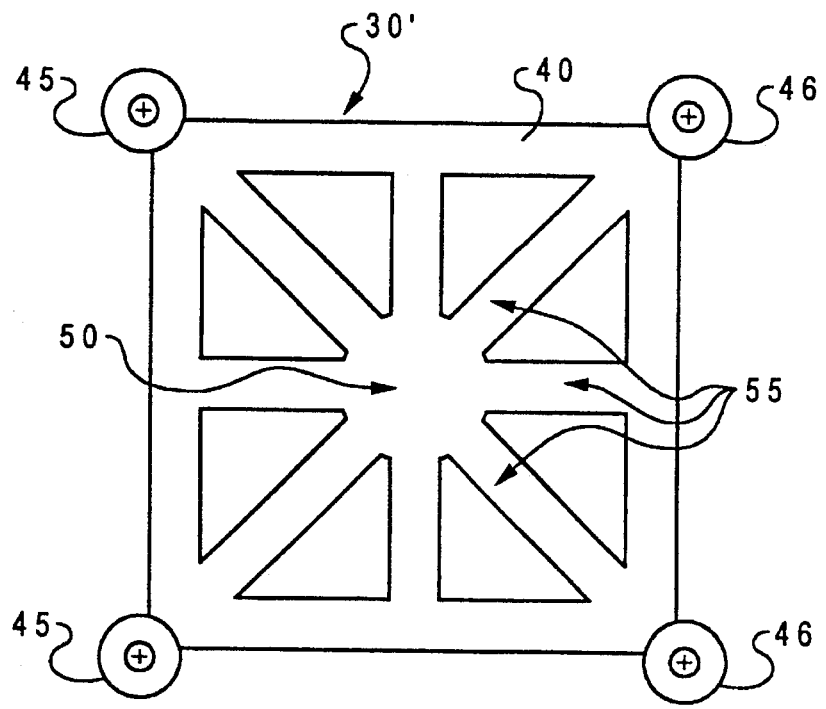
FIG. 5 depicts a top view of the stiffening structure employed in FIGS. 3 and 4.
Figure 6:
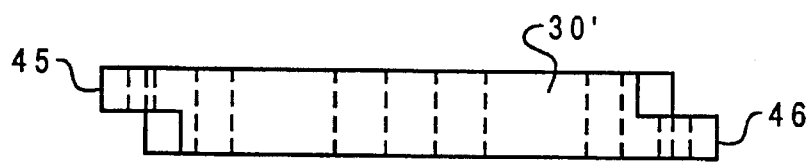
FIG. 6 depicts a side view of a stiffening structure of FIG. 5.

Referring now to FIGS. 5 and 6, there is shown a top view and a side view of the stiffening structure 30', in accordance with the present invention. Referring first to FIG. 5, there is shown a top view of the stiffening structure 30', which is formed as a plate. Center support portion 50 is used as an adhesion area to which an adhesive or epoxy can be applied to mount the stiffening structure to the printed circuit board. Extending from the center portion 50 are support ribs 55 that are attached to an outer portion 40 running around the periphery of the stiffening structure and connecting the ends of the support ribs 55. At each of the outer corners of the stiffening structure are interlocking means 45, 46. Each of the interlocking means 45, 46 are circular portions extending from the outer portion 40, and having mounting holes at their centers.

Referring now to FIG. 6, there is shown a side view of the stiffening structure 30', in accordance with the present invention. Interlocking means 45, 46 are cylindrical portions extending from the outer portion 40 having a height half that of the outer portion 40. As can be seen in FIG. 6, interlocking means 45 extend from the upper half of the outer portion 40, and interlocking means 46 extend from the lower half of outer portion 40.

Figure 7:
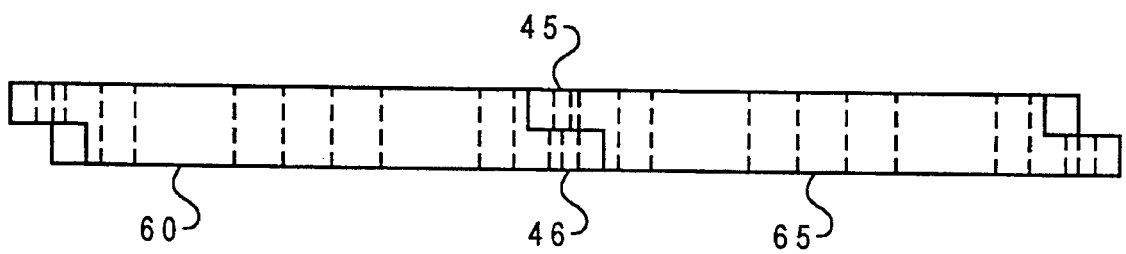
FIG. 7 depicts two stiffening structures of FIG. 5, interlocked together.

According to the present invention, when two modules are mounted to the printed circuit board adjacent to each other, the associated stiffening structures can be interlocked using interlocking means 45, 46 to form a single stiffening structure to be shared by the modules. As can be seen in FIG. 7, two stiffening structures 60, 65 are shown ganged together using the interlocking means of the present invention. Interlocking means 46 of stiffening structure 60 has been inserted into the space directly below interlocking means 45 of stiffening structure 65. Interlocking means 46 may be bonded to interlocking means 45 with adhesive or epoxy to rigidly connect stiffening structure 60 with stiffening structure 65. Alternatively, if the standoffs 35, 37 (FIG. 4) are being used to mount heat sinks to the modules above, the legs of the standoffs can be inserted through the mounting holes of interlocking means 46, 45 to rigidly connect the interlocking means of the two stiffening structures.

It will be appreciated by those skilled in the art that the present invention is applicable as a strain relief device for array mounted surface mounted components, peripheral leaded modules, or any other electronic packages that are mounted directly to the printed circuit board and anchored to the board primarily by their electrical connections.

While the invention has been particularly shown and described with reference to a preferred embodiment, it will be understood by those skilled in the art that various changes in form and detail may be made therein without departing from the spirit and scope of the invention.

What is claimed is:

1. A circuit card having module strain relief, comprising:
    a printed circuit board having a front and a back;
    a single module closed on all sides and having a plurality of electrical connections making electrical connection with the printed circuit board and anchoring the module directly to the front of the printed circuit board; and
    a stiffening structure to provide rigidity to the printed circuit board that is mounted to, and in contact with a portion of the back of the printed circuit card directly opposite from the module mounted on the front of the circuit card, the stiffening structure being substantially coextensive with the plurality of electrical connections, and being of sufficient thickness and strength to resist flexure of the portion of the printed circuit board in contact with the stiffening structure in response to shock and vibration applied to the module.

2. A circuit card according to claim 1, further comprising a heat sink in contact with the module.

3. A circuit card according to claim 2, further comprising a plurality of standoff devices attached to the heat sink at first ends and to the stiffening structure at second ends opposite from the first ends for providing support to the heat sink.

4. A circuit card according to claim 3, wherein the standoff devices are shock absorbing.

5. A circuit card according to claim 3, wherein the standoff devices are thermal conductors to provide thermal connection between the heat sink and the stiffening structure.

6. A circuit card according to claim 3, wherein the standoff devices are spaced apart from each other.

7. A circuit card according to claim 1, wherein the stiffening structure comprises a plate having a center portion, support ribs extending from the center portion, and an outer portion attached to the support ribs at ends opposite from the center portion.

8. A circuit card according to claim 1, wherein the stiffening structure comprises interlocking means for locking the stiffening structure side-by-side to another stiffening structure.

9. A circuit card according to claim 8, wherein the stiffening structure comprises a plate having a contacting surface in contact with the printed circuit board, and wherein the interlocking means comprises at least one leg extending from a side edge of the stiffening structure and a side edge of another stiffening structure, the side edges being positioned to overlie each other, and the legs providing means for securing the side edges together.

10. A circuit card according to claim 8, further comprising a plurality of stiffening structures locked together via their interlocking means.

11. A circuit card having module strain relief and heat sink support, comprising:
    a printed circuit board having a front and a back;
    a single module closed on all sides and having a plurality of electrical connections making electrical connection with the printed circuit board and anchoring the module directly to the front of the printed circuit board;
    a stiffening structure to provide rigidity to the printed circuit board mounted to, and in contact with a portion of, the back of the printed circuit card directly opposite from the module mounted on the front of the circuit card, the stiffening structure having a perimeter at least coextensive with the plurality of electrical connections, and being of sufficient thickness and strength to resist flexure of the portion of the printed circuit board in contact with the stiffening structure in response to shock and vibration applied to the module wherein the stiffening structure comprises interlocking means for locking the stiffening structure to another stiffening structure;
    a heat sink in contact with the module; and
    a plurality of standoff devices spaced apart and attached to the heat sink at first ends and to the stiffening structure at second ends opposite from the first ends for providing support to the heat sink.

12. A circuit card according to claim 11, further comprising a plurality of stiffening structures locked together via their interlocking means.

* * * * *